(12) United States Patent
Rathsack et al.

(10) Patent No.: US 9,005,877 B2
(45) Date of Patent: Apr. 14, 2015

(54) METHOD OF FORMING PATTERNS USING BLOCK COPOLYMERS AND ARTICLES THEREOF

(75) Inventors: Benjamen M. Rathsack, Austin, TX (US); Mark H. Somervell, Austin, TX (US); Meenakshisundaram Gandhi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 13/472,442

(22) Filed: May 15, 2012

(65) Prior Publication Data

US 2013/0309457 A1 Nov. 21, 2013

(51) Int. Cl.
| G03F 7/26 | (2006.01) |
|---|---|
| G03F 7/00 | (2006.01) |
| G03F 7/20 | (2006.01) |
| G03F 7/40 | (2006.01) |

(52) U.S. Cl.
CPC ............... *G03F 7/40* (2013.01); *G03F 7/0002* (2013.01); *G03F 7/2041* (2013.01); *Y10T 428/24802* (2015.01)

(58) Field of Classification Search
CPC ..... G03F 7/40; G03F 7/405; H01L 21/02123; H01L 21/02222; H01L 21/02282; H01L 21/0234; H01L 21/0337; H01L 21/31138; H01L 21/3125
USPC .................................. 430/313, 314, 330, 322
See application file for complete search history.

(56) References Cited

U.S. PATENT DOCUMENTS

| 5,344,742 A | 9/1994 | Sinta et al. |
|---|---|---|
| 5,650,261 A | 7/1997 | Winkle |
| 6,303,477 B1 | 10/2001 | Ianovitch |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |

(Continued)

FOREIGN PATENT DOCUMENTS

| DE | 102012105384 A1 | 9/2012 |
|---|---|---|
| KR | 20120133272 A | 12/2012 |

(Continued)

OTHER PUBLICATIONS

Cheng et al., "Developing Directly Photodefinable Substrate Guiding Layers for Block Copolymer Directed Self-Assembly (DSA) Patterning" Advances in Resist Materials and Processing Technology XXVIII, Proc. of SPIE vol. 7972, 2011, 13 pp.

(Continued)

*Primary Examiner* — Caleen Sullivan

(74) *Attorney, Agent, or Firm* — Wood, Herron & Evans, LLP

(57) ABSTRACT

A method for patterning a layered structure is provided that includes performing photolithography to provide a developed prepattern layer on a horizontal surface of an underlying substrate, modifying the prepattern layer to form spaced apart inorganic material guides, casting and annealing a layer of a self-assembling block copolymer to form laterally-spaced cylindrical features, forming a pattern by selectively removing at least a portion of one block of the self-assembling block copolymer, and transferring the pattern to the underlying substrate. The method is suitable for making sub-50 nm patterned layered structures.

15 Claims, 5 Drawing Sheets

(56) References Cited

U.S. PATENT DOCUMENTS

| | | | |
|---|---|---|---|
| 7,754,518 B2 | 7/2010 | Koelmel et al. | |
| 7,923,373 B2 | 4/2011 | Sandhu | |
| 8,039,196 B2 | 10/2011 | Kim et al. | |
| 8,083,953 B2 | 12/2011 | Millward et al. | |
| 8,241,822 B2 | 8/2012 | Yamato et al. | |
| 8,420,304 B2 | 4/2013 | Inatomi | |
| 8,603,867 B2 | 12/2013 | Kim et al. | |
| 2002/0192619 A1 | 12/2002 | Besek | |
| 2002/0193619 A1 | 12/2002 | Crivello et al. | |
| 2003/0084925 A1 | 5/2003 | Nakajima et al. | |
| 2005/0056219 A1 | 3/2005 | Dip et al. | |
| 2005/0215713 A1 | 9/2005 | Hessell et al. | |
| 2006/0123658 A1 | 6/2006 | Izumi | |
| 2006/0251989 A1 | 11/2006 | Breyta et al. | |
| 2007/0037412 A1 | 2/2007 | Dip et al. | |
| 2007/0237697 A1 | 10/2007 | Clark | |
| 2007/0238028 A1 | 10/2007 | Inatomi | |
| 2008/0122125 A1* | 5/2008 | Zhou | 257/797 |
| 2008/0193658 A1* | 8/2008 | Millward | 427/401 |
| 2008/0311402 A1* | 12/2008 | Jung et al. | 428/409 |
| 2008/0318005 A1 | 12/2008 | Millward | |
| 2009/0081827 A1 | 3/2009 | Yang et al. | |
| 2009/0087664 A1 | 4/2009 | Nealey et al. | |
| 2009/0181171 A1 | 7/2009 | Cheng et al. | |
| 2009/0200646 A1 | 8/2009 | Millward et al. | |
| 2009/0236309 A1 | 9/2009 | Millward et al. | |
| 2009/0291397 A1* | 11/2009 | DeVilliers | 430/319 |
| 2010/0055621 A1 | 3/2010 | Hatakeyama et al. | |
| 2010/0227276 A1 | 9/2010 | Mizuno | |
| 2011/0033786 A1 | 2/2011 | Sandhu | |
| 2011/0059299 A1 | 3/2011 | Kim et al. | |
| 2011/0147984 A1 | 6/2011 | Cheng et al. | |
| 2011/0147985 A1 | 6/2011 | Cheng et al. | |
| 2011/0229120 A1 | 9/2011 | Takaki et al. | |
| 2011/0272381 A1 | 11/2011 | Millward et al. | |
| 2012/0046415 A1 | 2/2012 | Millward et al. | |
| 2012/0046421 A1 | 2/2012 | Darling et al. | |
| 2012/0077127 A1 | 3/2012 | Sills et al. | |
| 2012/0088192 A1 | 4/2012 | Trefonas et al. | |
| 2013/0189504 A1 | 7/2013 | Nealey et al. | |
| 2014/0061154 A1 | 3/2014 | Kim et al. | |
| 2014/0099583 A1 | 4/2014 | Holmes et al. | |
| 2014/0154630 A1 | 6/2014 | Schmid et al. | |

FOREIGN PATENT DOCUMENTS

| | | |
|---|---|---|
| WO | 03016209 A1 | 2/2003 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Liu et al., "Integration of Block Copolymer Directed Assembly with 193 Immersion Lithography" American Vacuum Society, J. Vac. Sci. Technol. B 28(6), Nov./Dec. 2010, 5 pp.
Cushen et al., "Oligosaccharide/Silicon-Containing Block Copolymers with 5 nm Features for Lithographic Applications" ACS Nano, vol. 6, No. 4, 2012, pp. 3424-3433, Mar. 28, 2012.
Dean, et al., "Orientation Control of Silicon-containing Block Copolymer Films," Dept. of Chemical Engineering, The University of Texas at Austin, 1 p.
Cheng, et al., "EUVL Compatible, LER Solutions using Functional Block Copolymers," Alternative Lithographic Technologies IV, Proc. of SPIE, vol. 8323, 2012, 11 pp.
Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.
U.S. Patent and Trademark Office, International Search Report and Written Opinion issued in corresponding International Application No. PCT/US13/40815, mailed Oct. 21, 2013, 15 pp.

Bielawski et al., "Regiospecific One-Pot Synthesis of Diaryliodonium Tetrafluoroborates from Arylboronic Acids and Aryl Iodides," J. Org. Chem. 73:4602-4607, 2008.
Cheng et al., "Simple and Versatile Methods to Integrate Directed Self-Assembly with Optical Lithography Using a Polarity-Switched Photoresist," ACS Nano, 4(8):4815-4823, 2010.
Cho et al., "Polymer Bound Photobase Generators and Photoacid Generators for Pitch Division Lithography," Proc. of SPIE. 7972:797221(1)-797221(8), 2011.
Cupta, "Photoacid Generators for Catalytic Decomposition of Polycarbonate," Thesis for Master of Science, Georgia Institute of Technology, 2006, 137 pp.
Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).
Maki et al., "Photocleavable Molecule for Laser Desorption Ionization Mass Spectrometry," J. Org. Chem. 72:6427-6433, 2007.
Padmanaban et al., "Application of Photodecomposable Base Concept to 193 nm Resists," Proc. of SPIE. 3999:1136-1146, 2000.
Ross et al., "Si-containing block copolymers for self-assembled nanolithography," J. Vac. Sci. Technol. B. 26(6):2489-2494, 2008.
Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.
Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.
Ruebner et al., "A cyclodextrin dimer with a photocleavable linker as a possible carrier for the photosensitizer in photodynamic tumor therapy," PNAS. 96(26):14692-14693, 1999.
Skulski, "Organic Iodine(I, III, and V) Chemistry: 10 Years of Development at the Medical University of Warsaw, Poland," Molecules. 5:1331-1371, 2000.
Weissman et al., "Recent advances in ether dealkylation," Tetrahedron. 61:7833-7863, 2005.
Gotrik et al., "Morphology Control in Block Copolymer Films Using Mixed Solvent Vapors," ACS Nano, 6(9):8052-8059, 2012.
Hammersky et al., "Self-Diffusion of a Polystyrene-Polyisoprene Block Copolymer," Journal of Polymer Science: Part B: Polymer Physics. 34:2899-2909, 1996.
Jung et al., "Orientation-Controlled Self-Assembled Nanolithography Using a Polystyrene-Polydimethylsiloxane Block Copolymer," Nano Lett. 7(7):2046-2050, 2007.
Jung et al., "A Path to Ultranarrow Patterns Using Self-Assembled Lithography," Nano Lett. 10:1000-1005, 2010.
Postnikov et al., "Study of resolution limits due to intrinsic bias in chemically amplified photoresists," J. Vac. Sci. Technol. B. 17(6):3335-3338, 1999.
Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.
Choi et al., "Square Arrays of Holes and Dots Patterned from a Linear ABC Triblock Terpolymer," ACS Nano, 6(9):8342-8348, 2012.
Foubert et al., "Impact of post-litho LWR smoothing processes on the post-etch patterning result," Proc. of SPIE, 7972:797213(1)-797213(10), 2011.
Tavakkoli K.G. et al., "Templating Three-Dimensional Self-Assembled Structures in Bilayer Block Copolymer Films," Science, 336:1294-1298, 2012.
Lickteig et al., "Optimization of an Integrated and Automated Macro Inspection System for the Utilization of Wafer Color Variation Detection in a Photolithography Cluster", Metrology, Inspection, and Process Control for Microlithography, Proc. of SPIE vol. 6152, 9 pp.
Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

(56) References Cited

OTHER PUBLICATIONS

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene—poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

International Searching Authority, Search Report and Written Opinion issued in corresponding International Application No. PCT/US2014/027016 dated Jul. 23, 2014, 11 pages.

International Searching Authority, Search Report and Written Opinion issued in corresponding International Application No. PCT/US2014/023926 dated Jul. 25, 2014, 10 pages.

International Searching Authority, Search Report and Written Opinion issued in corresponding International Application No. PCT/US2014/016760 dated Nov. 6, 2014, 11 pages.

* cited by examiner

METHOD OF FORMING PATTERNS USING BLOCK COPOLYMERS AND ARTICLES THEREOF

FIELD OF THE INVENTION

This disclosure is related to methods for forming patterns in layered articles, and the layered articles formed therefrom; and more specifically, to utilizing cylindrical microdomains of block copolymers to define line features.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Design rules define the space tolerance between devices or interconnect lines so as to ensure that the devices or lines do not interact with one another in any unwanted manner. One important layout design rule that tends to determine the overall size and density of the semiconductor device is a critical dimension (CD). A critical dimension of a circuit is defined as the smallest width of a line or the smallest space between two lines. Another critical design rule is minimum pitch, which is defined as the minimum width of a given feature plus the distance to the adjacent feature edge.

Photolithography is a standard technique utilized to manufacture semiconductor wafers by transferring geometric shapes and patterns on a mask to the surface of a semiconductor wafer. The basic photolithographic process includes projecting a patterned light source onto a layer of radiation-sensitive material, such as a photoresist layer, which is then followed by a development step.

To create finely detailed patterns with small critical dimensions and pitch requires projecting a clearly imaged light pattern. But the ability to project a clear image of a small feature onto the semiconductor wafer is limited by the wavelength of the light that is used, and the ability of a reduction lens system to capture enough diffraction orders from the illuminated mask. Current state-of-the-art photolithography tools use deep ultraviolet (DUV) light with wavelengths of 248 or 193 nm, which allow minimum feature sizes down to about 50 nm.

The minimum feature size that a projection system can print is given approximately by:

$$CD = k_1 \cdot \lambda / N_A$$

where CD is the minimum feature size or the critical dimension; $k_1$ is a coefficient that encapsulates process-related factors, and typically equals 0.4 for production; $\lambda$ is the wavelength of light used; and $N_A$ is the numerical aperture of the lens, as seen from the semiconductor wafer. According to this equation, minimum feature sizes can be decreased by decreasing the wavelength and/or by increasing the numerical aperture to achieve a tighter focused beam and a smaller spot size.

A photolithographic process utilizes an exposure tool to irradiate the layer of radiation-sensitive material on a wafer through a mask to transfer the pattern on the mask to the wafer. As the critical dimensions of the pattern layout approach the resolution limit of the lithography equipment, optical proximity effects (OPE) begin to influence the manner in which features on a mask transfer to the layer of radiation-sensitive material such that the mask and actual layout patterns begin to differ. Optical proximity effects are known to result from optical diffraction in the projection system. The diffraction causes adjacent features to interact with one another in such a way as to produce pattern-dependent variations; the closer together features are, the more proximity effect is seen. Thus, the ability to locate line patterns close together encroaches on optical parameter limitations.

Accordingly, new and improved methods for patterning semiconductor devices are therefore needed, so as to accomplish the continued miniaturization of a circuit pattern formed on a semiconductor wafer.

SUMMARY OF THE INVENTION

Embodiments of the invention provide methods for patterning a layered structure. According to an embodiment, a method of patterning a layered structure comprises forming a photoimageable layer on a horizontal surface of an underlying substrate; imaging the photoimageable layer to form an imaged pattern in the photoimageable layer; developing the imaged pattern to remove portions of the photoimageable layer to form a prepattern layer comprising unremoved portions of the photoimageable layer; modifying the prepattern layer to provide a plurality of spaced apart inorganic material guides; casting a layer of a block copolymer between the spaced apart inorganic guides, the block copolymer having a $\chi N$ parameter equal to or greater than about 10.5 and comprising a first polymer block and a second polymer block, wherein the first and second polymer blocks have an etch selectivity greater than 2 under a first set of etching conditions; annealing the layer of the block copolymer to form a plurality of cylindrical systems that are generally parallel to the surface of the substrate; forming a pattern by selectively removing the first polymer block of the block copolymer under the first set of etching conditions to provide laterally-separated features comprising the second polymer block of the block copolymer and the plurality of spaced apart inorganic material guides; and transferring the pattern to the underlying substrate.

According to another embodiment of the present invention a method for patterning a layered structure is provided, the method comprising forming a photoimageable layer on a horizontal surface of an underlying substrate; imaging the photoimageable layer to form an imaged pattern in the photoimageable layer; developing the imaged pattern to remove portions of the photoimageable layer to form a prepattern layer comprising unremoved portions of the photoimageable layer; depositing an inorganic layer having a first thickness on the unremoved portions of the photoimageable layer; etching the inorganic layer to expose the unremoved portions of the photoimageable layer; removing the unremoved portions of the photoimageable layer to provide a plurality of spaced apart inorganic material guides; casting a layer of a block copolymer between the spaced apart inorganic guides, the block copolymer having a $\chi N$ parameter equal to or greater than about 10.5 and comprising a first polymer block and a second polymer block, wherein the first and second polymer blocks have an etch selectivity greater than 2 under a first set of etching conditions; annealing the layer of the block copolymer to form a plurality of cylindrical systems that are generally parallel to the surface of the underlying substrate; forming a pattern by selectively removing the first polymer block of the block copolymer under the first set of etching conditions to provide laterally-separated features comprising the second polymer block of the block copolymer and the plurality of spaced apart inorganic material guides; and transferring the pattern to the underlying substrate.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF THE DRAWINGS

Methods for patterning a layered structure to perform pitch multiplication are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
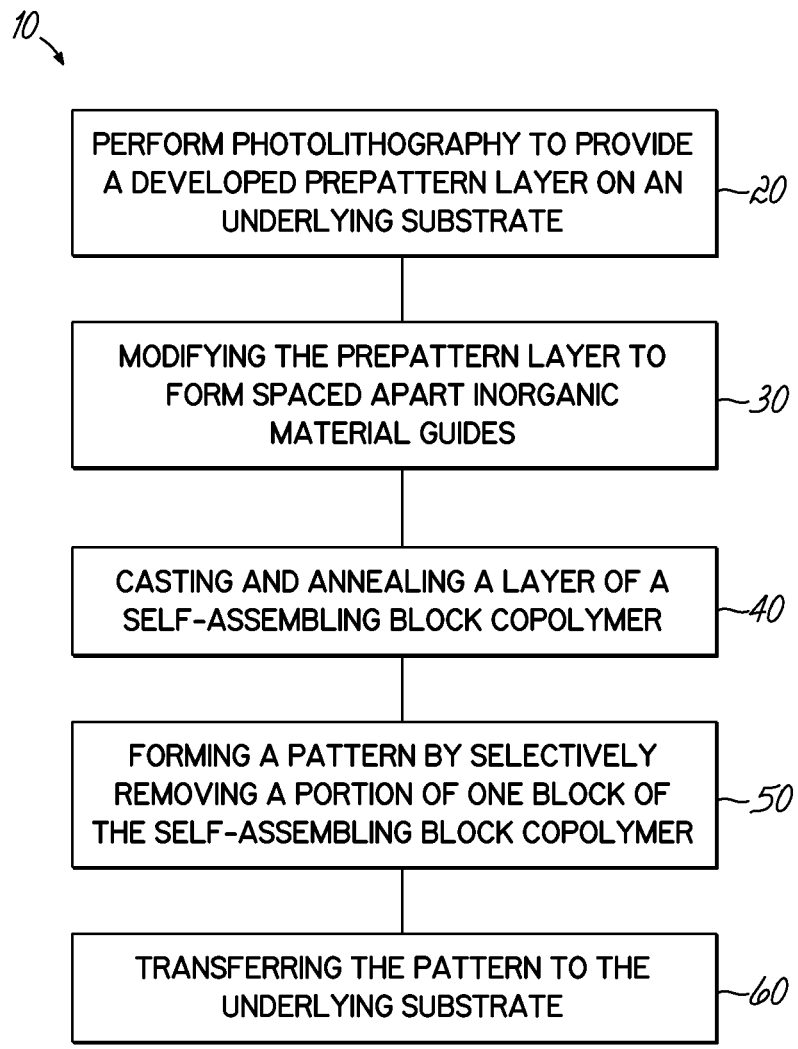
FIG. 1 is flow chart illustrating a method for patterning a layered structure, in accordance with an embodiment of the invention.

Referring to FIG. 1, in accordance with embodiments of the present invention, a method 10 for patterning a layered structure includes, performing photolithography to provide a developed prepattern layer on an underlying substrate 20, modifying the prepattern layer to form spaced apart inorganic material guides 30, casting and annealing a layer of a self-assembling block copolymer 40, forming a pattern by selectively removing at least a portion of one polymer block of the self-assembling block copolymer 50, and transferring the pattern to the underlying substrate 60. According to embodiments of the present invention, the method 10 is suitable for making sub-50 nm features, e.g., 8 nm or 16 nm half pitch (HP) patternings, as described below.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and $N$ is the total degree of polymerization for the block copolymer. According to embodiments of the present invention, the $\chi N$ value of one polymer block with at least one other polymer block in the larger polymer may be equal to or greater than about 10.5.

As used herein, the term "block copolymer" means and includes a polymer composed of chains where each chain contains two or more polymer blocks as defined above and at least two of the blocks are of sufficient segregation strength (e.g. $\chi N > 10.5$) for those blocks to phase separate. A wide variety of block polymers are contemplated herein including diblock copolymers (i.e., polymers including two polymer blocks (AB)), triblock copolymers (i.e., polymers including three polymer blocks (ABA or ABC)), multiblock copolymers (i.e., polymers including more than three polymer blocks (ABCD, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, or bicontinuous gyroid microdomains, where the molecular weight of the block copolymer dictates the sizes of the microdomains formed. The domain size or pitch period ($L_O$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure.

The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The term "preferential wetting," as used herein, means and includes wetting of a contacting surface by a block copolymer wherein one polymer block of the block copolymer will wet a contacting surface at an interface with lower free energy than the other block(s). For example, preferential wetting may be achieved or enhanced by treating the contacting surface with a material that attracts a first polymer block and/or repels a second polymer block of the block copolymer.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g. organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a diblock copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a copolymer mask are disclosed in U.S. Pat. No. 7,579,278; and U.S. Pat. No. 7,723,009, the entire disclosure of each of which is incorporated by reference herein.

According to an embodiment of the present invention, the directed self-assembly block copolymer is a block copolymer comprising a first polymer block and a second polymer block, where the first polymer block inherently has an etch selectivity greater than 2 over the second block polymer under a first set of etch conditions. According to one embodiment, the first polymer block comprises a first organic polymer, and the second polymer block comprises a second organic polymer. In another embodiment, the first polymer block is an organic polymer and the second polymer block is an organometallic-containing polymer. As used herein, the organometallic-containing polymer includes polymers comprising inorganic materials. For example, inorganic materials include, but are not limited to, metalloids such as silicon, and/or transition metals such as iron.

It will be appreciated that the total size of each block copolymer and the ratio of the constituent blocks and monomers may be chosen to facilitate self-organization and to form organized block domains having desired dimensions and periodicity. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains.

Moreover, the types of self-assembled microdomains formed by the block copolymer are readily determined by the volume fraction of the first block component to the second block components.

According to one embodiment, when the volume ratio of the first block component to the second block component is greater than about 80:20, the block copolymer will form an ordered array of spheres composed of the second polymeric block component in a matrix composed of the first polymeric block component. Conversely, when the volume ratio of the first block component to the second block component is less than about 20:80, the block copolymer will form an ordered array of spheres composed of the first polymeric block component in a matrix composed of the second polymeric block component.

When the volume ratio of the first block component to the second block component is less than about 80:20 but greater than about 65:35, the block copolymer will form an ordered array of cylinders composed of the second polymeric block component in a matrix composed of the first polymeric block component. Conversely, when the volume ratio of the first block component to the second block component is less than about 35:65 but greater than about 20:80, the block copolymer will form an ordered array of cylinders composed of the first polymeric block component in a matrix composed of the second polymeric block component.

When the volume ratio of the first block component to the second block component is less than about 65:35 but is greater than about 35:65, the block copolymer will form alternating lamellae composed of the first and second polymeric block components.

Therefore, the volume ratio of the first block component to the second block component can be readily adjusted in the block copolymer in order to form desired self-assembled periodic patterns. According to embodiments of the present invention, the volume ratio of the first block component to the second block component is less than about 80:20 but greater than about 65:35 to yield an ordered array of cylinders composed of the second polymeric block component in a matrix composed of the first polymeric block component.

Exemplary organic polymers include, but are not limited to, poly(9,9-bis(6'-N,N,N-trimethylammonium)-hexyl)-fluorene phenylene) (PFP), poly(4-vinylpyridine) (4PVP), hydroxypropyl methylcellulose (HPMC), polyethylene glycol (PEG), poly(ethylene oxide)-co-poly(propylene oxide) di- or multiblock copolymers, poly(vinyl alcohol) (PVA), poly(ethylene-co-vinyl alcohol) (PEVA), poly(acrylic acid) (PAA), polylactic acid (PLA), poly(ethyloxazoline), a poly(alkylacrylate), polyacrylamide, a poly(N-alkylacrylamide), a poly(N,N-dialkylacrylamide), poly(propylene glycol) (PPG), poly(propylene oxide) (PPO), partially or fully hydrolyzed poly(vinyl alcohol), dextran, polystyrene (PS), polyethylene (PE), polypropylene (PP), polyisoprene (PI), polychloroprene (CR), a polyvinyl ether (PVE), poly(vinyl acetate) ($PV_{Ac}$), poly(vinyl chloride) (PVC), a polyurethane (PU), a polyacrylate, an oligosaccharide, or a polysaccharide.

Exemplary organometallic-containing polymers include, but are not limited to, silicon-containing polymers such as polydimethylsiloxane (PDMS), polyhedral oligomeric silsesquioxane (POSS), or poly(trimethylsilylstyrene (PTMSS), or silicon- and iron-containing polymers such as poly(ferrocenyldimethylsilane) (PFS).

Exemplary block copolymers include, but are not limited to, diblock copolymers such as polystyrene-b-polydimethylsiloxane (PS-PDMS), poly(2-vinylpyridine)-b-polydimethylsiloxane (P2VP-PDMS), polystyrene-b-poly(ferrocenyldimethylsilane) (PS-PFS), or polystyrene-b-poly-DL-lactic acid (PS-PLA), or triblock copolymers such as polystyrene-b-poly(ferrocenyldimethylsilane)-b-poly(2-vinylpyridine) (PS-PFS-P2VP), polyisoprene-b-polystyrene-b-poly(ferrocenyldimethylsilane) (PI-PS-PFS), or polystyrene-b-poly(trimethylsilylstyrene)-b-polystyrene (PS-PTMSS-PS). In one embodiment, a PS-PTMSS-PS block copolymer comprises a poly(trimethylsilylstyrene) polymer block that is formed of two chains of PTMSS connected by a linker comprising four styrene units. Modifications of the block copolymers is also envisaged, such as that disclosed in U.S. Patent Application Publication No. 2012/0046415, the entire disclosure of which is incorporated by reference herein.

In one particular embodiment, the block copolymer used for forming the self-assembled periodic patterns is a PS-PDMS block copolymer. The polystyrene (PS) and the polydimethylsiloxane (PDMS) blocks in such a PS-PDMS block copolymer can each have a number average molecular weight ranging from about 10 kg/mol to about 100 kg/mol, with a number average molecular weight from about 20 kg/mol to about 50 kg/mole being more typical. Additionally, the volume fraction of the PDMS ($f_{PPMS}$) can range from about 20% to about 35%. In one embodiment, a PS-PDMS block copolymer having a 16 kg/mol molecular weight, with 33 vol % PDMS, provides cylindrical features having an 8 nm structure period ($L_S$). In another embodiment, a PS-PDMS block copolymer having a 32 kg/mol molecular weight with 33% PDMS provides cylindrical features having a 16 nm structure period ($L_S$).

Embodiments of the invention may also allow for the formation of features smaller than those that may be formed by block polymers alone or photolithography alone. In embodiments of the invention, a self-assembly material formed of different chemical species is allowed to organize to form domains composed of like chemical species. Portions of those domains are selectively removed to form temporary placeholders and/or mask features. A pitch multiplication process may then be performed using the temporary placeholders and/or mask features formed from the self-assembly material. Features with a pitch smaller than a pitch of the temporary placeholders may be derived from the temporary placeholders.

In some embodiments, inorganic guides or spacers are formed on sidewalls of temporary placeholders and the temporary placeholders may then be selectively removed. The inorganic guides, or other mask features derived from the guides, are used as part of a mask to pattern underlying materials, e.g., during the fabrication of integrated circuits.

Embodiments of the invention may form the mask features without using newer, relatively complex and expensive lithography techniques and the burden on the robustness of photoresist may be reduced. For example, rather than using relatively soft and structurally delicate photoresist in a mask, inorganic guides or mask features derived from the guides may be used as a mask. The use of inorganic guides allows the selection of a variety of materials for the guides, and the materials may be selected for robustness and compatibility with underlying materials used in a process flow.

Moreover, because the block copolymer material is also used as a mask for patterning underlying layers, the copolymer material is selected not only on its self-assembly behavior, but also based on its etch selectivity between the polymer blocks. Accordingly, the self-assembly behavior of the block copolymers allows the reliable formation of very small features, thereby facilitating the formation of a mask with a very small feature size. For example, features having a critical dimension of about 1 nm to about 100 nm, about 3 nm to about 50 nm or about 5 nm to about 30 nm may be formed.

FIGS. 2-9 illustrate a method for patterning a layered structure by utilizing guides to direct the self-assembly of a block copolymer with improved registration. According to an embodiment, a method for making an 8 nm or a 16 nm half-pitch (HP) pattern is provided. However, it should be appreciated that the critical dimension may be adjusted by modifying the block copolymer to change the domain period ($L_O$) and/or the structure period ($L_S$) of the block copolymer to match the desired critical dimension.

Figure 2:
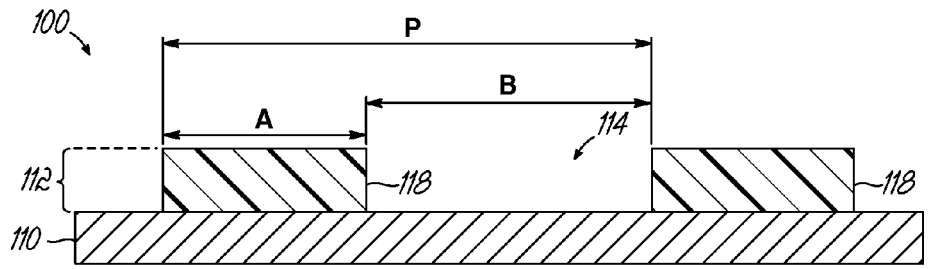
FIG. 2 is a schematic cross-sectional side view of a substrate with an overlying developed photoimageable layer after having removed portions of the photoimageable layer, in accordance with an embodiment of the invention.

With reference to FIG. 2, a cross-sectional side view of a layered structure 100 is illustrated having a substrate 110 with an overlying developed photoimageable layer 112 after having removed portions (spaces) 114 of the photoimageable layer 112 and leaving unremoved portions or features 118. Unremoved portions or features 118 in the photoimageable layer 112 may be formed using standard photolithographic techniques that are commonly used in the art. As shown, the unremoved portions or features 118 have a critical dimension A, and the spaces 114 have a critical dimension B, which thereby provides a pitch P equal to the sum of A+B.

According to one aspect, the photoimageable layer may be a photoresist layer, where the photoresist may be any photoresist compatible with extreme ultraviolet systems (e.g., 13.4 nm wavelength systems), 157 nm, 193 nm, 248 nm or 365 nm wavelength systems, or 193 nm wavelength immersion systems. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm. KrF photoresists are used with longer wavelength photolithography systems, such as 248 nm systems. In addition, while the use of self-organizing material and pitch multiplication in embodiments of the invention may obviate the need to define extremely small features with expensive, relatively new direct formation techniques such as extreme ultraviolet systems (including 13.4 nm wavelength systems) or electron beam lithographic systems, such systems may also be used, if desired. In addition, maskless lithography, or maskless photolithography, may be used to define the photoimageable layer 112. In other embodiments, the photoimageable layer 112 and any subsequent resist layers may be formed of a resist that may be patterned by nano-imprint lithography, e.g., by using a mold or mechanical force to form a pattern in the resist.

It will be appreciated that the pitch P of the resulting feature pattern 114/118, where the feature pattern 114/118 is defined by the unremoved portions 118 and the spaces 114, is equal to the sum of the width A of the unremoved portion 118 and the width B of a neighboring space 114. It should also be appreciated that the pitch P may be adjusted as necessary to achieve the desired pitch multiplication. In some embodiments, the pitch P of the feature pattern 114/118 may be, e.g., about 400 nm or less, about 300 nm or less, about 200 nm or less, or about 100 nm or less. In an exemplary embodiment, the feature pattern 114/118 may have a critical dimension A of about 64 nm, a critical dimension B of about 96 nm, and a pitch P of about 160 nm. In another exemplary embodiment, the feature pattern 114/118 may have a critical dimension A of about 32 nm, a critical dimension B of about 48 nm, and a pitch P of about 80 nm.

Figure 3:
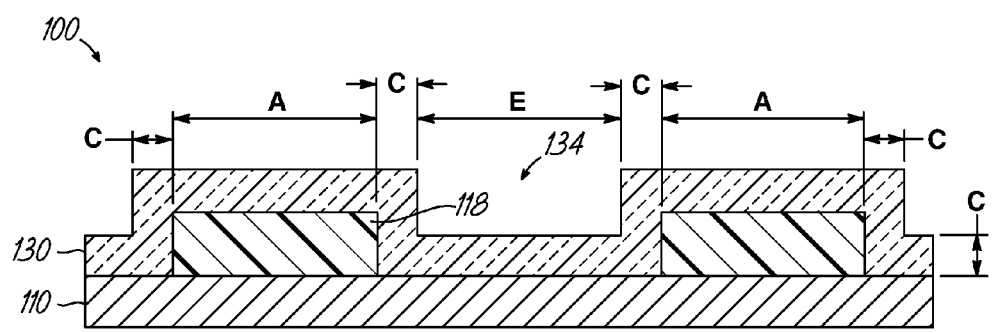
FIG. 3 is a schematic cross-sectional side view of the structure of FIG. 2 after depositing a layer of inorganic material over an unremoved portion of the photoimageable layer, in accordance with an embodiment of the invention.

With reference to FIG. 3, a layer 130 of an inorganic material having a thickness C is blanket deposited conformally over exposed surfaces, including the unremoved portions 118 of the photoimageable layer 112, and the underlying substrate 110. The inorganic material may be any material that may act as a mask for transferring a pattern to an underlying material. The spacer material: 1) may be deposited with good step coverage; 2) may be deposited at a temperature compatible with the unremoved portions 118 of the photoimageable layer 112; and 3) may be selectively etched relative to the unremoved portions 118. The inorganic material may comprise, without limitation, a silicon-containing material, or an organometallic material. The silicon-containing spacer materials may be, without limitation, silicon, silicon oxide and its variants, silicon nitride and its variants and AlN. In the illustrated embodiment, the spacer material is silicon oxide.

According to an embodiment, a method for depositing a layer 130 of inorganic material includes atomic layer deposition (ALD), e.g., using a self-limiting deposition with a silicon precursor and a subsequent exposure to an oxygen or nitrogen precursor to form silicon oxides and nitrides, respectively. ALD may be performed at relatively low temperatures, e.g., under about 200° C. or under about 100° C., which may prevent thermal damage to underlying thermally sensitive materials, if present. For example, ALD may be used to prevent damage to the unremoved portions 118 of the photoimageable layer 112. In other embodiments, chemical vapor deposition is used to deposit the layer 130 of the inorganic material.

The thickness C of the layer 130 is determined based upon the desired width of the inorganic material guides 140 (FIG. 4), which are, in turn, based on the $L_S$ of the block copolymer and in consideration of the etch bias of the inorganic material guides 140 and the block copolymer. In some embodiments, the layer 130 is deposited to a thickness of about 5 nm to about 80 nm, about 6 nm to about 60 nm, about 8 nm to about 40 nm, or about 16 nm to about 30 nm to form inorganic material guides of roughly similar widths. The step coverage is about 80% or greater and or about 90% or greater.

It should be appreciated that the thickness C of the layer 130 may be controlled in consideration of the structure periodicity ($L_S$) of the block copolymer domains, as well as the critical dimension of a desired width E of the space 134 between the inorganic material guides 140 and the etch bias of the materials. For example, if the block copolymer provides a cylindrical domain with a structure period ($L_S$) of about 16 nm or about 8 nm, the thickness C of the layer 130 can be sized accordingly. The width B of the neighboring space 114 shown in FIG. 2 is reduced by twice the thickness C to provide width E of the space 134 (i.e., E≈B−2C) in FIG. 3. Accordingly, by appropriately designing the critical dimensions A, B and pitch (A+B) of the photoimageable layer 112, the width E of space 144 can be adjusted to approximately the same size as the width A of space 142, if desired.

Figure 4:
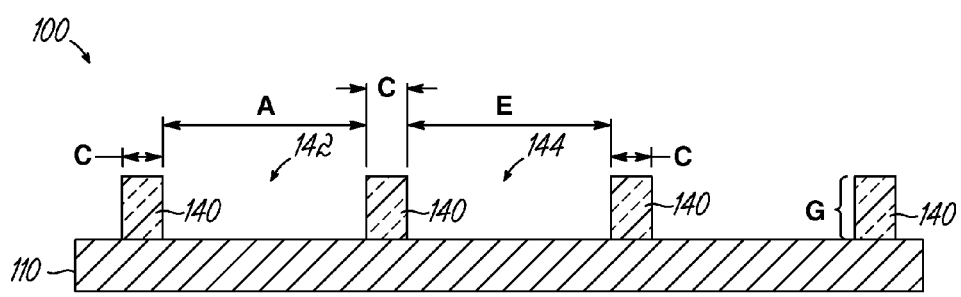
FIG. 4 is a schematic cross-sectional side view of the structure of FIG. 3 after etching the layer of inorganic material to provide a plurality of spaced apart inorganic material guides, in accordance with an embodiment of the invention.

With continued reference to FIGS. 3 and 4, the layer 130 of the inorganic material is subjected to an anisotropic etch to remove inorganic material from horizontal surfaces 150 of the layered structure 100. Such an etching process, also known as a spacer etch, may be performed using a fluorocarbon plasma, e.g., a $CF_4$, $CHF_3$ and/or $NF_3$ containing plasma. After completing the anisotropic etch, which exposes the unremoved portions 118 of the photoimageable layer 112, the unremoved portions 118 are removed to provide a plurality of spaced apart inorganic material guides 140 (e.g., the column between spaces 142, 144). The manner of removal is not particularly limited, so long as the integrity of the inorganic material guides 140 is not adversely affected. The inorganic material guides 140 serve as mandrels for the casting of a layer of the block copolymer, and serve to improve registration of the self-assembled block copolymer cylindrical domains.

In addition to defining the height G of the inorganic material guides 140 by the etching process, it should be appreciated that this dimension can be adjusted by controlling the thickness of the photoimageable layer 112.

In accordance with an embodiment of the invention, if desired, a trim etch process may be performed to reduce the critical dimension C and/or height G of the inorganic material guides 140 prior to casting a layer of the block copolymer.

Figure 5:
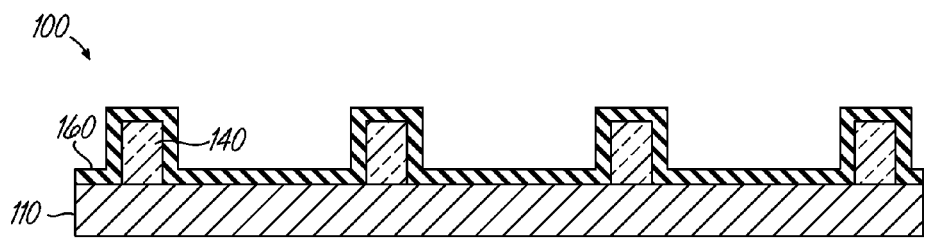
FIG. 5 is a schematic cross-sectional side view of the structure of FIG. 4 after treating the spaced apart inorganic material guides with a material that attracts a first polymer block and/or repels a second polymer block of a block copolymer, in accordance with an embodiment of the invention.
Figure 6:
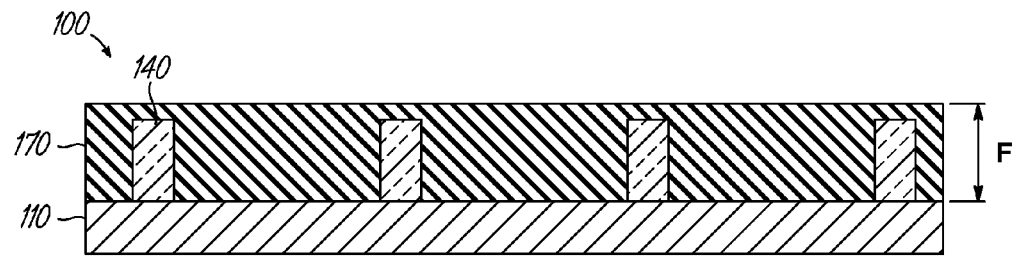
FIG. 6 is a schematic cross-sectional side view of the structure of FIG. 5 after casting a layer of a block copolymer between the spaced apart inorganic material guides, in accordance with an embodiment of the invention.

With reference to FIGS. 5 and 6, a block copolymer is next applied and allowed to self-assemble to form a mask pattern over the substrate 110. With reference to FIG. 5, according to an embodiment, a film 160 of a surface modifying material is deposited between and over the plurality of spaced apart inorganic material guides 140. The surface modifying material serves to attract one of the polymer blocks and/or repel another polymer block of the block copolymer, and permits or enhances preferential wetting. According to an embodiment, the film 160 of surface modifying material is an organic polymer having etch resistance properties that are substantially similar to the polymer block that it attracts, and having etch resistance properties that are substantially different from the polymer block that it repels. For example, for a block copolymer comprising polystyrene, the surface modifying material may be an organic polymer such as hydroxyl-terminated polystyrene. As used herein, "substantially similar" etch resistance properties is understood to mean that the surface modifying material and the polymer block it attracts are removed under a single etching condition at about the same etch selectivity or rate. Conversely, "substantially different" etch resistance properties is understood to mean that the surface modifying material and the polymer block that it repels are not removed under a single etching condition at about the same etch selectivity or rate. The surface modifying material may be applied by spin coating as a solution in a suitable organic solvent.

The block copolymer comprises at least two polymer blocks, which may be selectively etched relative to one another, i.e., the block copolymer has an etch selectivity greater than 2 under a first set of etching conditions. Furthermore, the block copolymer can self-organize in a desired and predictable manner, e.g., the polymer blocks are immiscible and will segregate under appropriate conditions to form domains predominantly containing a single block species. In an exemplary illustrated embodiment, the block copolymer is a diblock copolymer, comprising, e.g., polystyrene (PS) and poly-dimethylsiloxane (PDMS), which have an etch selectivity greater than two (2) under an oxygen plasma etch.

Figure 7:
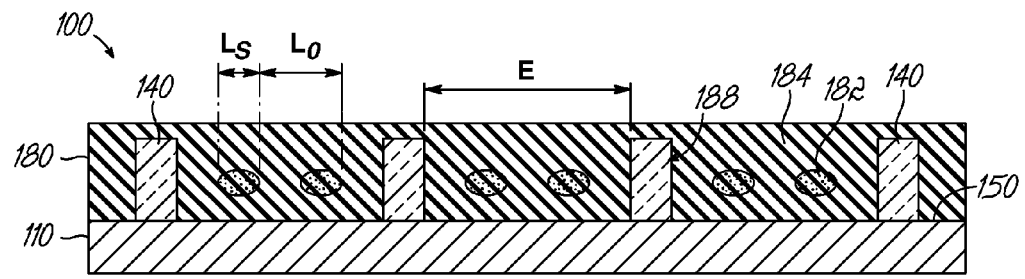
FIG. 7 is a schematic cross-sectional side view of the structure of FIG. 6 after annealing the layer of the block copolymer to afford cylindrical systems that are generally parallel to a horizontal surface of the substrate, in accordance with an embodiment of the invention.

In some embodiments, the block copolymers are selected to provide a plurality of laterally separated cylindrical systems that are generally parallel to the horizontal surface 150 of the substrate 110, to provide a consistent spacing between inorganic material guides 140 (FIG. 7). As discussed above, the critical dimension E can be designed in relation to the period ($L_O$) such that the ratio is approximately an integer value between about 1 to about 8, depending on the desired degree of pitch multiplication. For example, for a block copolymer that possesses an $L_O$ equal to about 32 nm, E could be designed to be about 32 nm, about 64 nm, about 96 nm, about 128 nm, about 160 nm, about 192 nm, about 224 nm, or 256 nm. Thus, according to embodiments of the invention, the pitch multiplication can be from 1, 2, 3, 4, 5, 6, 7, or 8.

Figure 14:
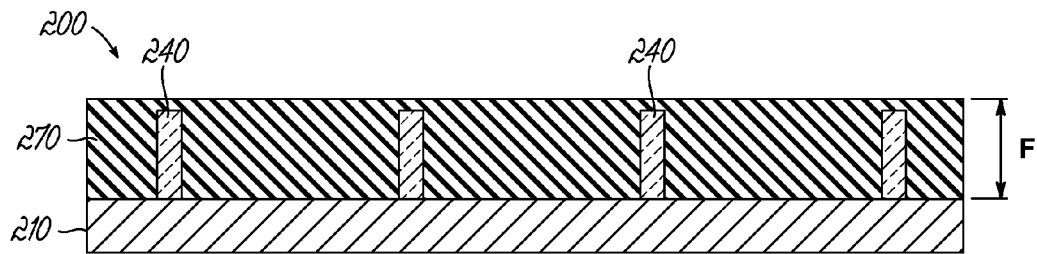
FIG. 14 is a schematic cross-sectional side view of the structure of FIG. 13 after casting a layer of a block copolymer between the spaced apart inorganic material guides, in accordance with an embodiment of the invention.
Figure 15:
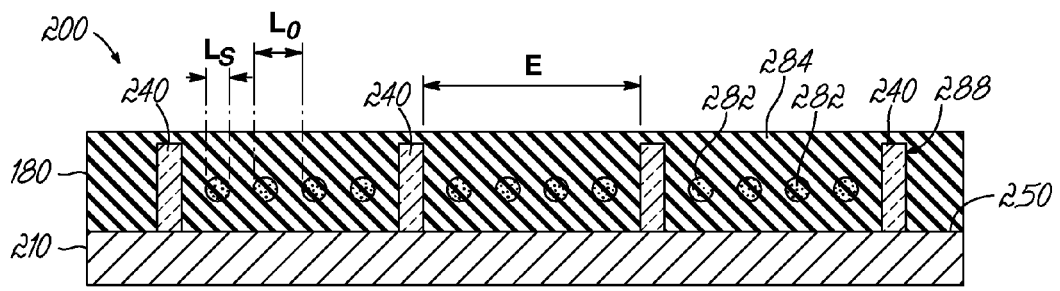
FIG. 15 is a schematic cross-sectional side view of the structure of FIG. 14 after annealing the layer of the block copolymer to afford cylindrical systems that are generally parallel to a horizontal surface of the substrate, in accordance with an embodiment of the invention.

The block copolymers may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure 100 and the carrier solvent subsequently removed. The thickness F of the block copolymer film 170 may be chosen based upon the desired pattern to be formed by the block copolymer. For example, the film thickness may be controlled to correlate to the period ($L_O$) of the self-assembled block copolymer. In accordance with an embodiment of the present invention, the film thickness F ranges from a value equal to about the period ($L_O$) to about twice the period ($L_O$) of the assembled block copolymer. For example, where $L_O$ of the block copolymer is about 32 nm, the film 170 of the block copolymer is equal to or greater than about 32 nm, as shown in FIGS. 6-7, but can range up to and including about 64 nm, for example. Where $L_O$ of the block copolymer is about 16 nm, the layer 270 of the block copolymer is equal to or greater than about 16 nm, as shown in FIGS. 14-15, but can range up to and including about 32 nm, for example.

It should be appreciated that, up to a particular thickness related to the polymer length scale and the environment in which the polymers are disposed, e.g., the distance between and the height of the inorganic material guides 140, the copolymers will typically orient to form laterally-spaced cylindrical domains that form parallel lines, as viewed in a top-down view. Such laterally-spaced cylindrical domains may be used to multiply the pitch of the layered structure shown in FIGS. 7 and 15.

It will be appreciated that the thickness F of the block copolymer film 170 may be greater than, equal to or less than the height G of the inorganic material guides 140. Similar to above, the height G of the inorganic material guides 140 may be designed accordingly to correspond to about 0.5×F to about 2×F, where the thickness F of the block copolymer layer is itself based on $L_O$ of the block copolymer. As illustrated and discussed further below, a thickness F, which is greater than the height G of the inorganic material guides 140, e.g., 2×G, may be used to provide a copolymer reservoir. In other embodiments, a thickness F that is equal to, or less than the height G of the inorganic material guides 140 may be used to form isolated islands of copolymers between the inorganic material guides 140, thereby preventing cross-diffusion of copolymers between the islands.

While the invention is not bound by theory, it will be appreciated that the different block species are understood to self-aggregate due to thermodynamic considerations in a process similar to the phase separation of materials. The self-organization is guided by the inorganic material guides 140, which encourage the constituent blocks of the block copolymers to orient themselves along the length of the inorganic material guides 140 due to interfacial interactions. It will be appreciated that the self-organization may result in a more efficient packing of the copolymer species. As a result, in some cases, the free copolymers available for the self-organization may be depleted if the copolymer film 170 extends over too large of an expanse, causing an area in the middle of the expanse to be formed without organized copolymers or with poorly organized copolymers. Thus, in order to obviate this commonly encountered problem and improve registration, the block copolymer film 170 is sufficiently thick to extend above the inorganic material guides 140 to provide a reservoir of copolymers for the self-organization that occurs between the inorganic material guides 140. An additional aspect of the embodiment that improves registration includes designing the distance between the inorganic material guides 140 (i.e., critical dimension E of the space) to be sufficiently small to minimize the depletion effect that often occurs over large expanses. According to one embodiment, the critical dimension E of the space is less than about 200 nm. For example, the critical dimension E of the spaces 142, 144 between the inorganic material guides 140 can be about 180 nm, about 150 nm, about 120 nm, about 100 nm, 75 nm, about 50 nm, about 30 nm, or between ranges thereof, depending on the $L_O$ of the block copolymer.

With reference to FIGS. 6 and 7, the film of the block copolymer 170 is exposed to annealing conditions to facilitate the self-assembly of the block copolymer into a plurality of cylindrical features 182, which are generally parallel to each other, the horizontal surface 150 of the substrate, and vertical surfaces 188 of the inorganic material guides 140. The self-organization may be facilitated and accelerated by annealing the layered structure 100. The temperature of the annealing process may be chosen to be sufficiently low to prevent adversely affecting the block copolymers or the layered structure 100. The anneal may be performed at a temperature of less than about 350° C., less than about 300° C., less than about 250° C., less than about 200° C. or about 180° C. in some embodiments.

According to another embodiment, the annealing process may include a solvent anneal, which generally reduces the annealing temperature. The annealing process may also be used to cause cross-linking of the copolymers, thereby stabilizing the copolymers for later etching and pattern transfer steps.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 260° C. to about 350° C., wherein the low oxygen atmosphere comprises less than about 40 ppm oxygen. For example, the block copolymer film 170 may be exposed to annealing conditions of 310° C. in less than about 40 ppm oxygen for about a 2 minutes to about 5 minutes.

Figure 8:
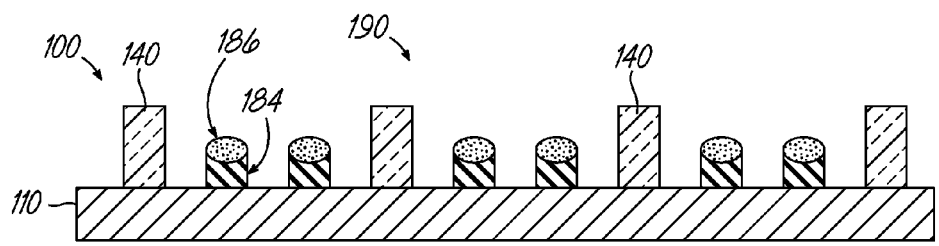
FIG. 8 is a schematic cross-sectional side view of the structure of FIG. 7 after selectively removing portions of the first block copolymer to provide laterally-separated features comprising the second polymer block and the plurality of spaced apart inorganic material guides, in accordance with an embodiment of the invention.

With reference to FIGS. 6 and 7, the annealing step of the film of block copolymer 170 forms a layer of self-assembled block polymer having cylindrical features 182 that are formed of the second polymer block, and surrounding regions 184 that are formed of the first block polymer. At least a portion of the regions 184 is selectively removed, leaving behind etched cylindrical features 186, small sections of surrounding regions 184, and the inorganic material guides 140, as shown in FIG. 8. It will be appreciated that portions of the surrounding regions 184, which are formed of the first block polymer, may be removed in a single step using a single etch chemistry or may be removed using multiple etches with different etch chemistries to provide a pattern 190. For example, where the surrounding regions 184 are formed of polystyrene (PS) and the cylindrical features 182 are formed of polydimethylsiloxane (PDMS), the PS regions 184 may be removed by performing a selective oxygen plasma etch, which also partially oxidizes the PDMS cylindrical features 182 leaving etched cylindrical features 186 with properties similar to silica. According to an embodiment of the invention, the resulting pattern 190 may comprise silicon-containing etched cylindrical features 186 having an underlying region of PS regions 184. It will be appreciated that the dimensions of the resulting features may vary, depending on the size of the copolymer used and process conditions. For example, the silicon-containing etched cylindrical features 186 may have a critical dimension of about 50 nm to about 2 nm, about 35 nm or less to about 3 nm, with a pitch of about 100 nm to about 4 nm, or about 70 nm to about 6 nm.

The pattern 190 provided by etched cylindrical features 186 and inorganic material guides 140 thereby forms pitch-multiplied mask features. In the illustrated embodiment in FIG. 8, the pitch of the pattern 190 is approximately one third of the pitch for the inorganic material guides 140 shown in FIG. 4.

For example, where the critical dimension C of the inorganic material guides 140 is 16 nm and critical dimension E of the space 145 between the inorganic material guides 140 is about 64 nm (see FIG. 4), the etched cylindrical features 186, which were created by a PS-PDMS block copolymer having a 16 nm period, have a pitch of about 32 nm or less. It will be appreciated that higher orders of pitch multiplication can be achieved in some embodiments by using inorganic material guides with smaller critical dimension and/or using block copolymers that provide smaller critical dimension periods.

Figure 9:
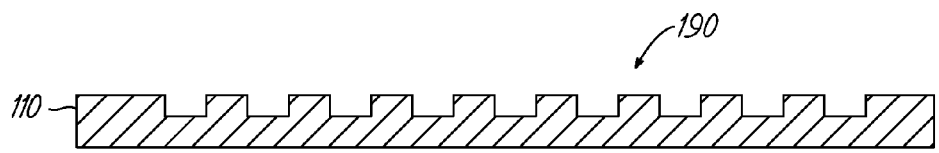
FIG. 9 is a schematic cross-sectional side view of the structure of FIG. 8 after transferring a pattern formed by the laterally-separated features to an underlying substrate, in accordance with an embodiment of the invention.

With reference to FIG. 9, the pattern 190 of FIG. 8 is transferred to the substrate 110 to provide a transferred pattern 195. The pattern transfer may be accomplished using etch chemistries appropriate for selectively etching the material or materials of the substrate 110 relative to the inorganic material guides 140 and the features 186. The skilled artisan can readily determine suitable etch chemistries for substrate materials. It will be appreciated that where the substrate 110 comprises layers of different materials, a succession of different chemistries, e.g., dry-etch chemistries, may be used to successively etch through these different layers, if a single chemistry is not sufficient to etch all the different materials. It will also be appreciated that, depending upon the chemistry or chemistries used, the inorganic material guides 140 and/or the features 186 may be etched.

In the illustrated embodiment of FIGS. 2-9, the inorganic material guides 140 and/or the etched cylindrical features 186 are sufficiently similar in etching rate to complete the etch of the substrate 110 with substantially uniform penetration.

Figure 10:
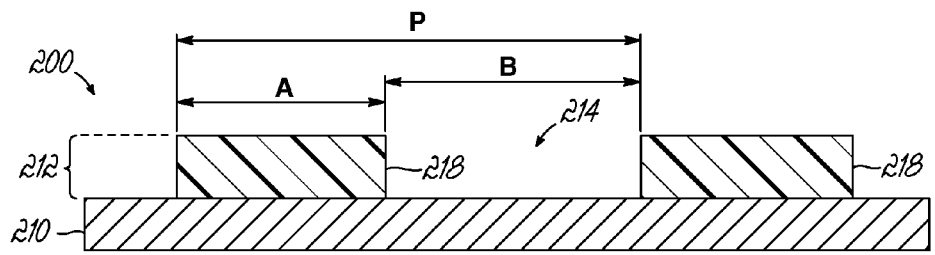
FIG. 10 is a schematic cross-sectional side view of a substrate with an overlying developed photoimageable layer after having removed portions of the photoimageable layer, in accordance with an embodiment of the invention.

In another embodiment shown in FIGS. 10-17, a method of patterning a layered structure 200 is provided, where the critical dimensions of features are designed to accommodate a pentuple pitch multiplication. With reference to FIG. 10, a cross-sectional side view of a layered structure 200 is illustrated having a substrate 210 with an overlying developed photoimageable layer 212 after having removed portions or spaces 214 of the photoimageable layer 212 and leaving unremoved portions or features 218. Unremoved portions or features 218 in the photoimageable layer 212 may be formed using standard photolithographic techniques that are commonly used in the art.

Figure 11:
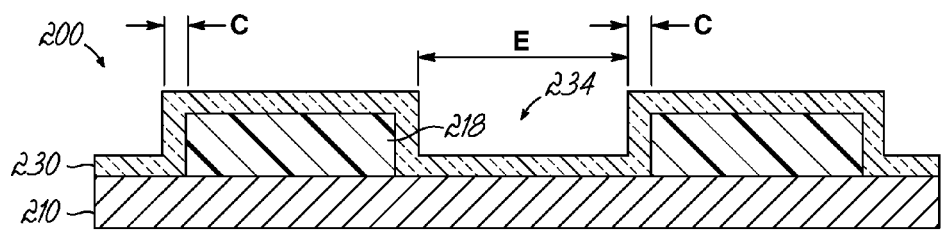
FIG. 11 is a schematic cross-sectional side view of the structure of FIG. 10 after depositing a layer of inorganic material over an unremoved portion of the photoimageable layer, in accordance with an embodiment of the invention.

With reference to FIG. 11, a layer 230 of an inorganic material having a thickness C is blanket deposited conformally over exposed surfaces, including the unremoved portions 218 of the photoimageable layer 212, and the underlying substrate 210.

Figure 12:
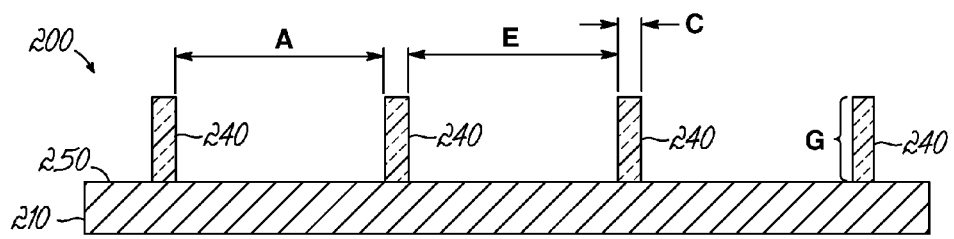
FIG. 12 is a schematic cross-sectional side view of the structure of FIG. 11 after etching the layer of inorganic material to provide a plurality of spaced apart inorganic material guides, in accordance with an embodiment of the invention.

With continued reference to FIGS. 11 and 12, the layer 230 of the inorganic material is then subjected to an anisotropic etch to remove material from horizontal surfaces 250 of the layered structure 200. After completing the anisotropic etch, which exposes the unremoved portions 218 of the photoimageable layer 212, of the layer 230 from the horizontal surfaces 250, the unremoved portions 218 are removed to provide a plurality of spaced apart inorganic material guides 240. The inorganic material guides 240 serve as mandrels for the casting of a layer of the block copolymer, and serve to improve registration of the self-assembled block copolymer cylindrical domains.

Figure 13:
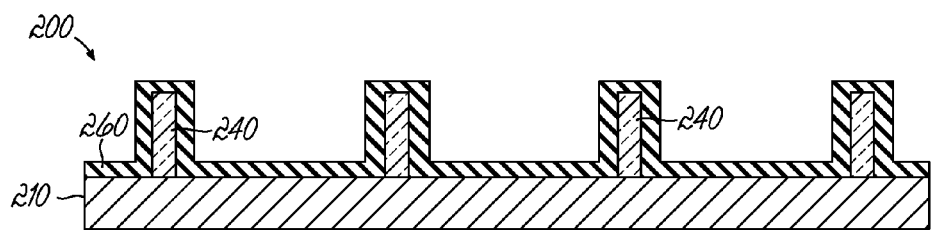
FIG. 13 is a schematic cross-sectional side view of the structure of FIG. 12 after treating the spaced apart inorganic material guides with a material that attracts a first polymer block and/or repels a second polymer block of a block copolymer, in accordance with an embodiment of the invention.

With reference to FIG. 13, according to an embodiment, a film 260 of a surface modifying material is deposited between and over the plurality of spaced apart inorganic materials guides 240. The surface modifying material serves to attract one of the polymer blocks and/or repel another polymer block of the block copolymer, and permits or enhances preferential wetting. With reference to FIG. 14, a layer of the block copolymer 270 is applied and subsequently allowed to self-assemble to form a mask pattern over the substrate 210.

With reference to FIGS. 14 and 15, the layer of block copolymer 270 is exposed to annealing conditions to facilitate the self-assembly of the block copolymer into a plurality of cylindrical features 282, which are generally parallel to each other, the horizontal surface of the substrate 250, and vertical surfaces 288 of the inorganic material guides 240. The self-organization may be facilitated and accelerated by annealing the layered structure 200. In the embodiment shown, the domain period ($L_O$) of the cylindrical features 282 is approximately a fifth of the critical dimensions A and E, and the structure periodicity ($L_S$) of the cylindrical features 282 is approximately a tenth of the critical dimensions A and E, which thereby facilitates the formation of four parallel cylindrical features 282.

Figure 16:
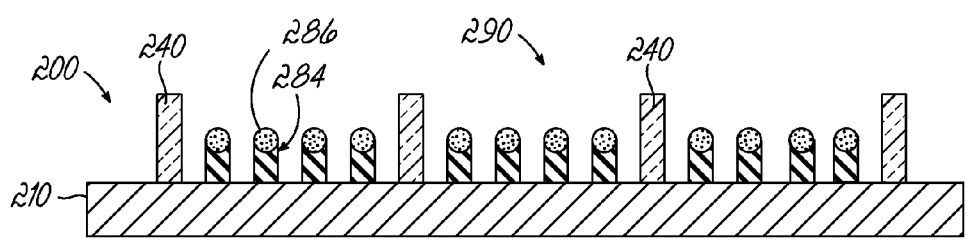
FIG. 16 is a schematic cross-sectional side view of the structure of FIG. 15 after selectively removing portions of the first block copolymer to provide laterally-separated features comprising the second polymer block and the plurality of spaced apart inorganic material guides, in accordance with an embodiment of the invention.

With reference to FIGS. 15 and 16, the annealing step of the layer of block copolymer 270 provides a layer of self-assembled block polymer having cylindrical features 282, which are formed of the second polymer block, and surrounding regions 284, which are formed of the first block polymer. At least a portion of the surrounding regions 284 is selectively removed, leaving behind the etched cylindrical features 286, small sections of surrounding regions 284, and the inorganic material guides 240, as shown in FIG. 16. It will be appreciated that portions of the surrounding regions 284 may be removed in a single step using a single etch chemistry or may be removed using multiple etches with different etch chemistries to provide a pattern 290.

Figure 17:
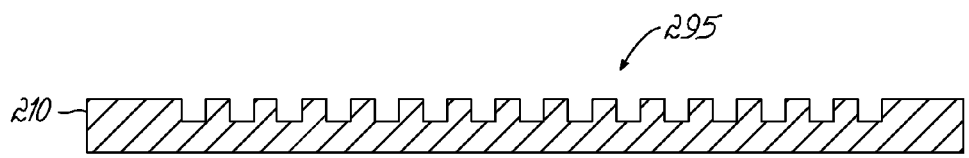
FIG. 17 is a schematic cross-sectional side view of the structure of FIG. 16 after transferring a pattern formed by the laterally-separated features to an underlying substrate, in accordance with an embodiment of the invention.

With reference to FIG. 17, the pattern 290 of FIG. 16 is transferred to the substrate 210 to provide a transferred pattern 295. The pattern transfer may be accomplished using etch chemistries appropriate for selectively etching the material or materials of the substrate 210 relative to the inorganic material guides 240 and the etched cylindrical features 286.

It will be appreciated that various modifications of the illustrated embodiments are possible. For example, while discussed in the context of diblock copolymers for ease of illustration and discussion, the copolymers may be formed of two or more block species. In addition, while the block species of the illustrated embodiment are each formed of a different monomer, the block species may share monomer(s). For example, the block species may be formed of different sets of monomers, some of which are the same, or may be formed of the same monomer, but in a different distribution in each block. The different sets of monomers form blocks having different properties which may drive the self-assembly of the copolymers.

It will be appreciated that, before or after transferring the mask patterns 190, 290 to the substrates 110, 210, additional mask patterns can be overlaid on the mask pattern 190, 290. For example, a planarizing material can be deposited between and over the inorganic material guides 140, 240 and the features 186, 286 and the planarizing material can be patterned to form an additional pattern. The additional pattern, forming a combined pattern with the mask pattern 190, 290 can be transferred to the underlying substrate 110, 210.

Also, while "processing" through a mask layer may encompass etching an underlying layer, processing through the mask layers may involve subjecting layers underlying the mask layers to any semiconductor fabrication process. For example, processing may involve ion implantation, diffusion doping, depositing, oxidizing (particularly with use of a hard mask under the polymer mask), nitridizing, etc. through the mask layers and onto underlying layers. In addition, the mask layers may be used as a stop or barrier for chemical mechanical polishing (CMP) or CMP may be performed on any of the layers to allow for both planarization and etching of the underlying layers.

In addition, while the illustrated embodiments may be applied to fabricate integrated circuits, embodiments of the invention may be applied in various other applications where the formation of patterns with very small features is desired. For example, embodiments of the invention may be applied to form gratings, disk drives, storage media or templates or masks for other lithography techniques, including X-ray or imprint lithography. For example, phase shift photomasks may be formed by patterning a substrate that has a film stack having phase shifting material coatings.

Consequently, it will be appreciated from the description herein that the invention includes various embodiments. For example, according to another embodiment of the invention, a method for patterning a semiconductor substrate is provided. The method comprises providing a layer comprising block copolymers. A first polymer block of the block copolymers is selectively removed to leave laterally separated cylindrical features comprising a second block of the block copolymers. Spacer material can be blanket deposited on the laterally separated cylindrical features comprising the second polymer block. The spacer material is etched to form spacers on sidewalls of the laterally separated cylindrical features. A pattern defined by the spacers is then transferred to the substrate.

According to other embodiments the invention, a method for forming a mask for patterning a substrate is provided. The method comprises providing a layer of a self-assembly block copolymer material. Like chemical species of the self-assembling block copolymer are aggregated to form a repeating pattern having cylindrical domains defined by the chemical species. One of the chemical species is preferentially removed to form spaced apart cylindrical features. Spacers are formed on sidewalls of the cylindrical features.

According to yet other embodiments of the invention, a method for integrated circuit fabrication is provided. The method comprises exposing a block copolymer layer to an etch to define free-standing, regularly-spaced, spaced-apart cylindrical features in the block copolymer layer. Spacers are formed on sidewalls of the cylindrical features. A pattern derived from the spacers is transferred to an underlying substrate.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

The invention claimed is:

1. A method for patterning a layered structure, comprising:
    forming a photoimageable layer on a horizontal surface of an underlying substrate;
    imaging the photoimageable layer to form an imaged pattern in the photoimageable layer;
    developing the imaged pattern to remove portions of the photoimageable layer to form a prepattern layer comprising unremoved portions of the photoimageable layer;
    depositing an inorganic material layer on the unremoved portions of the photoimageable layer;
    etching the inorganic material layer to expose the unremoved portions of the photoimageable layer;
    removing the unremoved portions of the photoimageable layer to provide the plurality of spaced apart inorganic material guides;
    treating the spaced apart inorganic material guides with a surface modifying material that attracts the first polymer block or repels the second polymer block of the block copolymer;
    casting a layer of a block copolymer between the spaced apart inorganic guides, the block copolymer having a $\chi N$ parameter equal to or greater than about 10.5 and comprising a first polymer block and a second polymer block, wherein the first and second polymer blocks have an etch selectivity greater than 2 under a first set of etching conditions;
    annealing the layer of the block copolymer to form a plurality of cylindrical systems that are generally parallel to the horizontal surface of the substrate;
    forming a pattern by selectively removing at least a portion of the first polymer block of the block copolymer under the first set of etching conditions to provide laterally-separated features comprising the second polymer block of the block copolymer and the plurality of spaced apart inorganic guides; and
    transferring the pattern to the underlying substrate.

2. The method of claim 1, wherein the surface modifying material is an organic polymer, having etch resistance properties substantially similar to the first polymer block of the block copolymer.

3. The method of claim 1, wherein the first polymer block comprises polystyrene, and wherein the organic polymer is a hydroxyl-terminated polystyrene.

4. The method of claim 1, wherein the first polymer block comprises an organic polymer and the second polymer block comprises an organometallic-containing polymer.

5. The method of claim 1, wherein the second polymer block comprises silicon and/or iron.

6. The method of claim 1, wherein the second polymer block comprises polydimethylsiloxane.

7. The method of claim 1, wherein the block copolymer comprises a polystyrene-polydimethylsiloxane copolymer.

8. The method of claim 1, wherein depositing the inorganic material layer comprises performing an atomic layer deposition of silicon oxide.

9. The method of claim 1, wherein the forming the pattern comprises performing a plasma etching process.

10. The method of claim 1, wherein the forming a photoimageable layer on a substrate comprises forming a 248 nm resist, a 193 nm resist, a 193 nm immersion resist, or an EUV resist, or a combination of two or more thereof.

11. The method of claim 1, wherein the annealing the layer of the block copolymer comprises heating to an annealing temperature greater than about 200° C. in a low oxygen atmosphere comprising less than about 50 ppm oxygen.

12. The method of claim 1, wherein the annealing the layer of the block copolymer comprises a solvent anneal process.

13. The method of claim 1, wherein the plurality of spaced apart inorganic material guides have a pitch of about 100 nm or less.

14. The method of claim 1, further comprising controlling the forming the pattern step by modifying a thickness of the inorganic layer, modifying a molecular weight of the second polymer block, or a combination thereof.

15. The method of claim 1, wherein the plurality of spaced apart inorganic material guides have a pitch of about 100 nm or less.

* * * * *